United States Patent
Tateiwa et al.

(10) Patent No.: US 6,593,170 B2
(45) Date of Patent: Jul. 15, 2003

(54) SEMICONDUCTOR WAFER DIVIDING METHOD

(75) Inventors: Satoshi Tateiwa, Tokyo (JP); Mirei Toida, Tokyo (JP)

(73) Assignee: Disco Corporation, Tokyo (JP)

(*) Notice: Subject to any disclaimer, the term of this patent is extended or adjusted under 35 U.S.C. 154(b) by 0 days.

(21) Appl. No.: 09/846,294

(22) Filed: May 2, 2001

(65) Prior Publication Data

US 2001/0041387 A1 Nov. 15, 2001

(30) Foreign Application Priority Data

May 11, 2000 (JP) ........................................ 2000-139111
May 11, 2000 (JP) ........................................ 2000-139135

(51) Int. Cl.[7] ............................................. H01L 21/44
(52) U.S. Cl. ........................................ 438/114; 438/118
(58) Field of Search ................................ 438/110, 113, 438/114, 118

(56) References Cited

U.S. PATENT DOCUMENTS 6,293,270 B1 * 9/2001 Okazaki .................. 125/13.01
6,344,402 B1 * 2/2002 Sekiya ....................... 438/460

FOREIGN PATENT DOCUMENTS

JP 11-074167 * 3/1999

* cited by examiner

Primary Examiner—William David Coleman
(74) Attorney, Agent, or Firm—Smith, Gambrell & Russell, LLP

(57) ABSTRACT

A method of dividing a semiconductor wafer of which the surface has a plurality of chips sectioned by streets, into individual chips, characterized in that it comprises a scribing step in which division guide lines are formed by drawing scribed lines along the streets on the surface of the semiconductor wafer, a tape sticking step in which a tape is stuck onto the surface having the division guide lines formed thereon, of the semiconductor wafer, and a back surface cutting step in which cutting grooves are formed in the back surface, to which the tape is stuck, of the semiconductor wafer such that a bit of uncut portions are left along the division guide lines.

4 Claims, 9 Drawing Sheets

(a)

(b)

(c)

(a)

(b)

(c)

SEMICONDUCTOR WAFER DIVIDING METHOD

FIELD OF THE INVENTION

The present invention relates to a method of dividing a semiconductor wafer having a plurality of circuits (chips) formed on the surface thereof, the circuits (chips) being sectioned by streets or by streets with a metal layer formed thereon, into individual chips.

DESCRIPTION OF THE PRIOR ART

For example, in the production of a semiconductor device, a surface of a substantially disk-like semiconductor wafer is sectioned into a plurality of rectangular regions by cutting lines called "streets" arranged in a lattice form and a predetermined circuit (chip) is formed in each of the rectangular regions. In the semiconductor wafer, further, a pattern formed from a metal such as aluminum or copper, that is called "TEG (Test Element Group)", is provided for testing the characteristic properties of each circuit (chip), and this metal layer is formed on the surface of each street in some cases. The plurality of rectangular regions each having a circuit (chip) formed therein are cut and separated from one another to form a so-called semiconductor chip. The semiconductor wafer is cut by a precision cutting machine that is generally called "dicing machine". In this dicing machine, the semiconductor wafer is cut along the streets formed on the surface of the semiconductor wafer with a rotary blade that has a thickness of about 20 $\mu$m and rotates at a high speed, thereby to divide it into chips. As another means of dividing the semiconductor wafer, cutting by using a laser beam or a point scriber for cutting glass is also now on trial.

Since the division of the semiconductor wafer by the dicing machine is thus carried out in such a manner that cutting grooves are formed by using a rotary blade rotating at a high speed while impact force is given to the streets to gradually break them, a plurality of chippings as fine as several microns are formed on both sides of each cutting groove. Therefore, as chips to be formed on the semiconductor wafer must be arranged in a range beyond the reach of chippings produced by cutting, each street needs to have a width of about 50 $\mu$m when a semiconductor wafer is cut by the dicing machine. To enhance the productivity of semiconductor chips, however, how many chips can be formed on one semiconductor wafer is a very important issue and hence, how narrow the width of each street where the chips are not formed can be made is the key to this end. Meanwhile, cutting by a point scriber or laser beam is not always satisfactory from a productivity standpoint because a yield of the product is lowered due to breakage or the like though the cutting width is small.

When the semiconductor wafer having streets of which the surface has a metal layer formed thereon is cut by a rotary blade, whiskered burrs tend to generate on both sides of a cutting groove because the metal layer is soft, sticky and easily deformed. The burr causes such undesirable problems as occurrence of a short-circuit between laminated layers or between bonding wires, scratches, or a damaged adjacent circuit when it falls off.

SUMMARY OF THE INVENTION

It is a first object of the present invention to provide a method of dividing a semiconductor wafer, which can narrow the width of the streets and hence, can enhance productivity with a good product yield.

It is a second object of the present invention to provide a method of dividing a semiconductor wafer, which is capable of dividing a semiconductor wafer having streets of which the surface has a metal layer formed thereon, without generating any burr.

To attain the above first object, according to the present invention, there is provided a method of dividing a semiconductor wafer of which the surface has a plurality of chips sectioned by streets, into individual chips, characterized in that the method comprises:

a scribing step in which division guide lines are formed by drawing scribed lines along the streets on the surface of the semiconductor wafer;

a tape sticking step in which a tape is stuck onto the surface having the division guide lines formed thereon, of the semiconductor wafer; and a back surface cutting step in which cutting grooves are formed in the back surface, to which the tape has been stuck, of the semiconductor wafer such that a bit of uncut portions are left along the division guide lines, and:

by the formation of the cutting grooves, the uncut portions are completely separated with the aid of the division guide lines to divide the semiconductor wafer into individual chips.

The division guide lines formed in the scribing step are formed by a scriber and the cutting grooves formed in the back surface cutting step are formed by a rotary blade.

To attain the second object, according to the present invention, there is provided a method of dividing a semiconductor wafer, of which the surface has a plurality of chips sectioned by streets with a metal layer formed thereon, into individual chips, characterized in that the method comprises:

a scribing step in which division guide lines are formed by drawing scribed lines along streets on the surface of the semiconductor wafer;

a tape sticking step in which a tape is stuck onto the surface having the division guide lines formed thereon, of the semiconductor wafer; and a back surface cutting step in which cutting grooves are formed in the back surface, to which the tape is stuck, of the semiconductor wafer such that a bit of uncut portions are left along the division guide lines, and:

by the formation of the cutting grooves, the uncut portions are completely separated with the aid of the division guide lines to divide the semiconductor wafer into individual chips.

The division guide lines formed in the scribing step are formed by breaking the metal layer formed on the streets by a roller scriber and the cutting grooves formed in the back surface cutting step are formed by a rotary blade.

DETAILED DESCRIPTION OF THE PREFERRED EMBODIMENT

Preferred embodiments of the present invention will be described in detail with reference to the accompanying drawings hereinafter.

Figure 1:
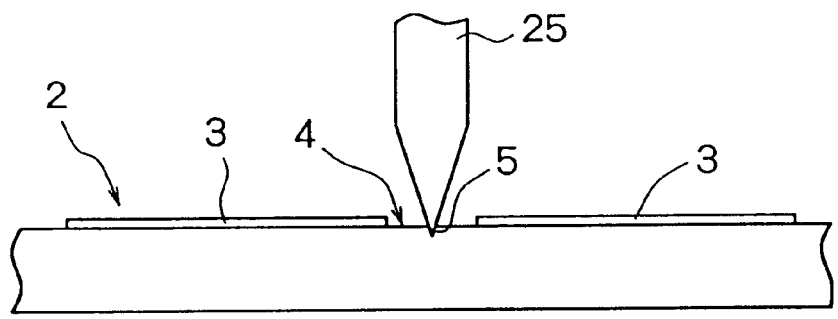
FIG. 1 are views for explaining each step of a method of dividing a semiconductor wafer according to a first embodiment of the present invention.
Figure 1:
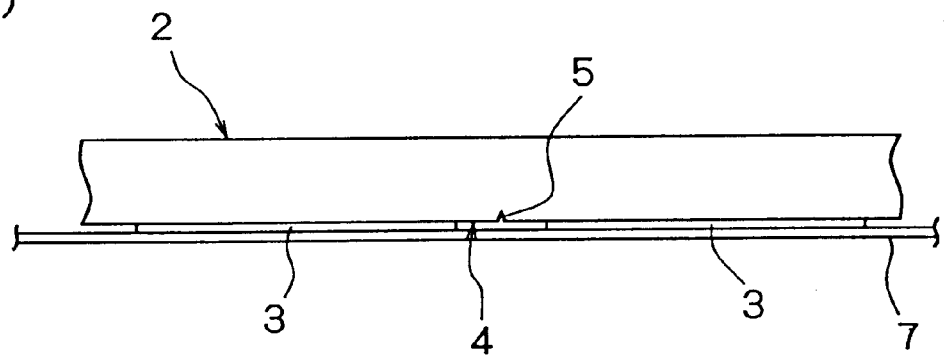
Figure 1:
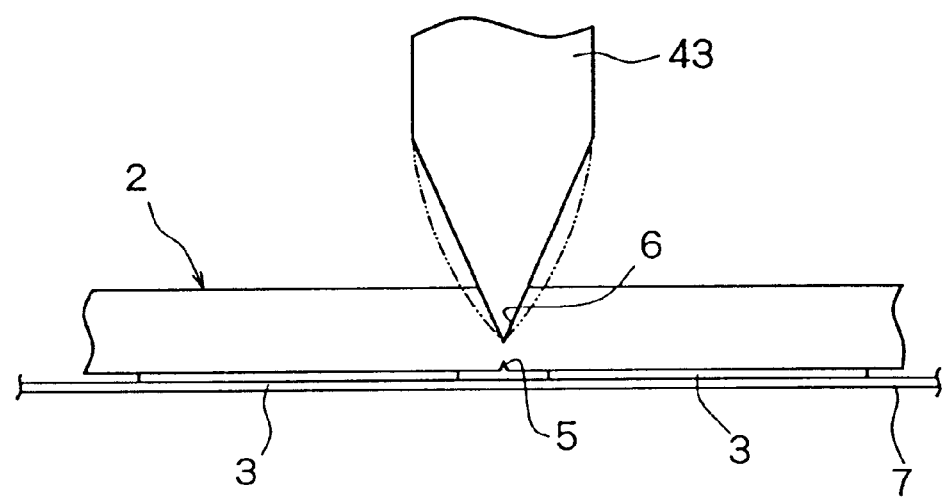

FIG. 1 shows the steps of a method of dividing a semiconductor wafer according to the first embodiment of the present invention.

The method of dividing a semiconductor wafer according to the present invention comprises a scribing step in which a division guide line 5 is formed by drawing a scribed lines along a street 4 formed between circuits (chips) 3 provided on the surface of a semiconductor wafer 2 as shown in FIG. 1(a), a tape sticking step in which a tape 7 is stuck onto the surface having the division guide line 5 formed thereon, of the semiconductor wafer 2 as shown in FIG. 1(b), and a back surface cutting step in which a cutting groove 6 is formed in the back surface of the semiconductor wafer 2 along the division guide line 5 as shown in FIG. 1(c). Each of the above steps will be described in further detail hereinafter.

The above scribing step will be described with reference to FIGS. 7 to 10.

Figure 7:
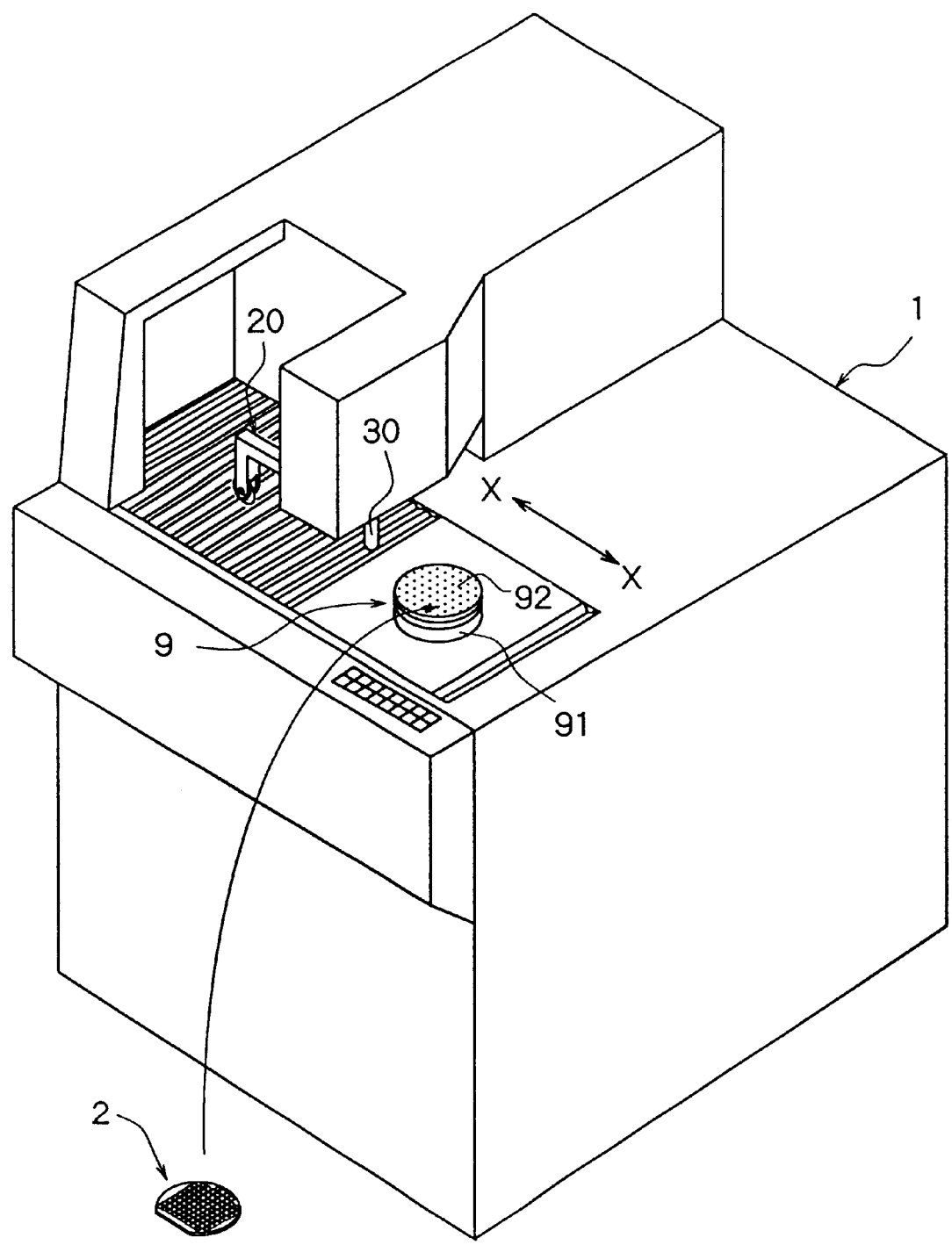
FIG. 7 is a perspective view of a scribing machine for carrying out the scribing step in the method of dividing a semiconductor wafer according to the present invention.
Figure 8:
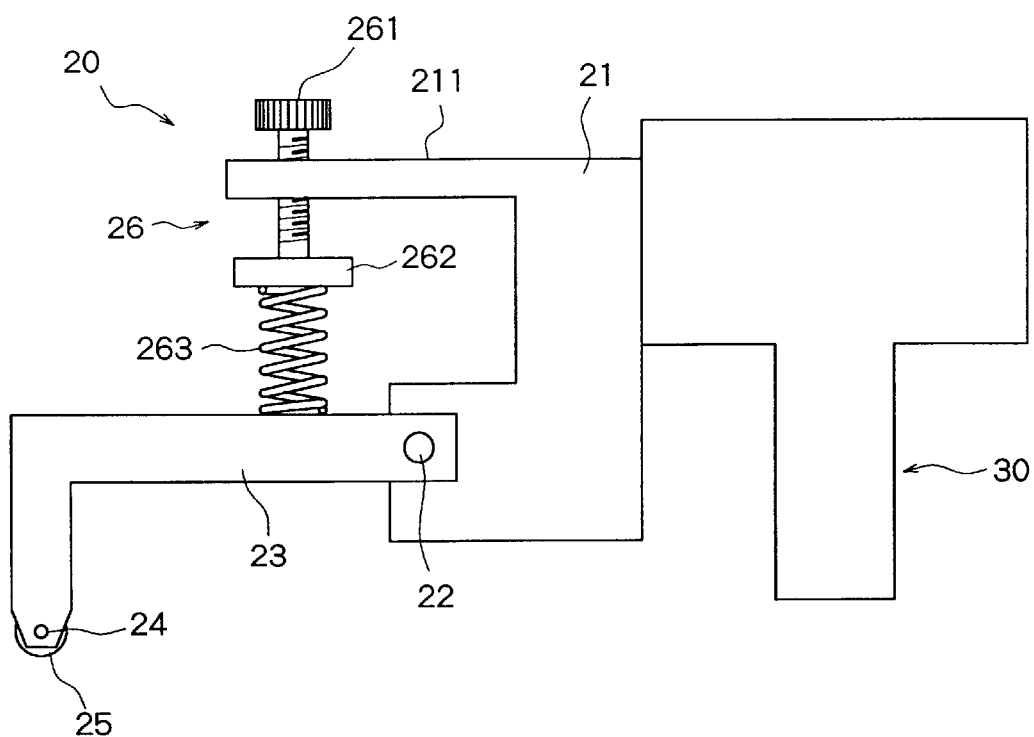
FIG. 8 is a front view of a scribing unit to be mounted on the scribing machine shown in FIG. 7.

FIG. 7 shows an embodiment of a scribing machine for carrying out the above scribing step. The scribing machine shown in FIG. 7 comprises a substantially rectangular parallelpiped housing 1. In this housing 1, a chuck table 9 for holding a workpiece is disposed so as to move in a direction indicated by an arrow X that is a feeding direction. The chuck table 9 comprises an adsorption chuck support base 91 and an adsorption chuck 92 mounted on the adsorption chuck support base 91 so that a disk-like semiconductor wafer 2 which is a workpiece is held on the adsorption chuck 92 by a suction means that is not shown. The chuck table 9 is constituted to be allowed to turn by a rotation mechanism (not shown).

Figure 9:
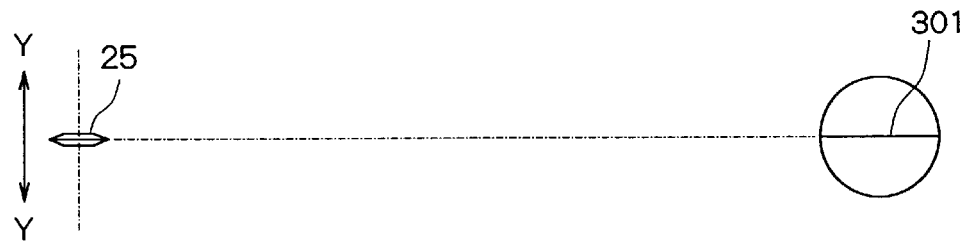
FIG. 9 is a diagram for explaining a relationship between the roller scriber and an alignment means of the scribing unit to be mounted on the scribing machine shown in FIG. 7.
Figure 10:
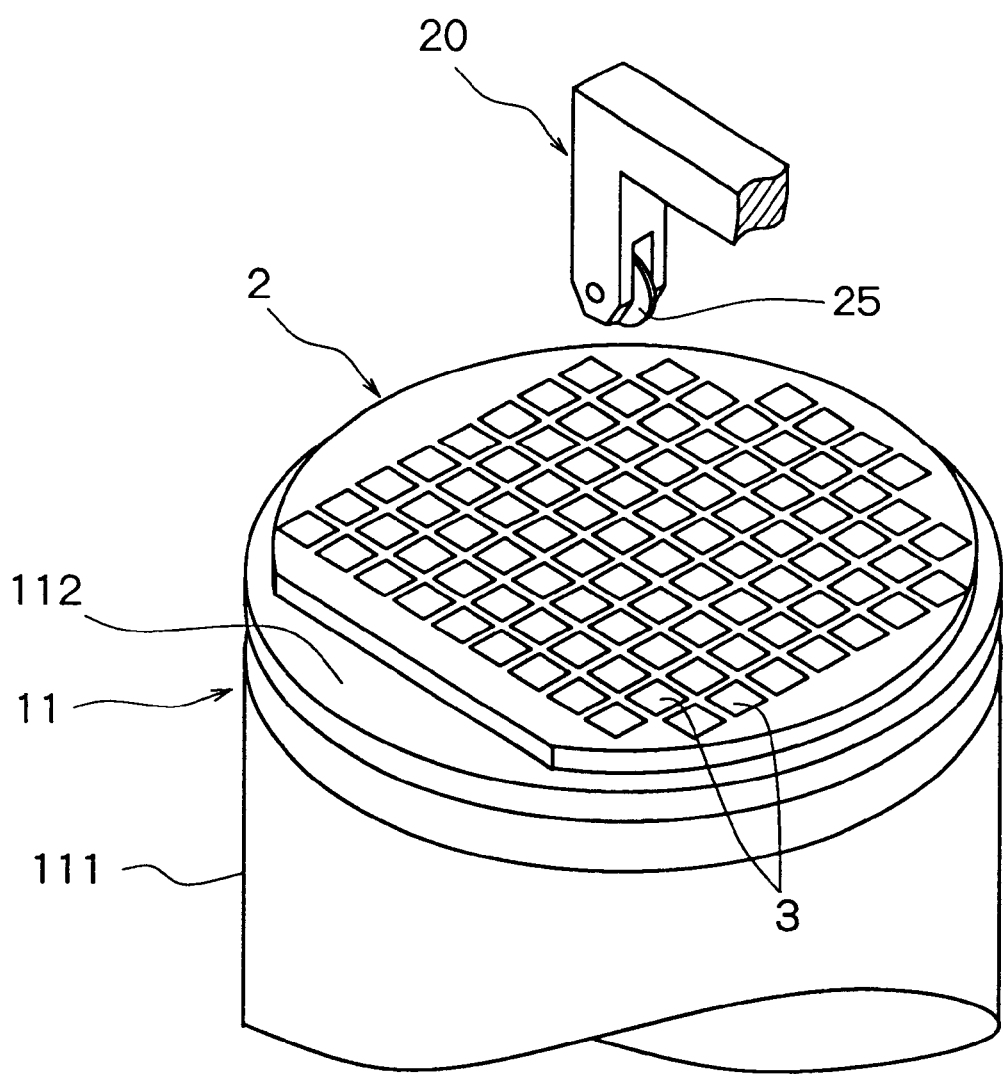
FIG. 10 is a perspective view of a main portion of the scribing machine shown in FIG. 7.

The scribing machine in the illustrated embodiment comprises a scribing unit 20 for forming the division guide lines 5 by drawing scribed lines along the streets 4 of the semiconductor wafer 2 held on the above chuck table 9. The scribing unit 20 will be described with reference to FIGS. 8 and 9. The scribing unit 20 comprises a movable base 21, a scriber support member 23 one end of which is held to the movable base 21 by a support shaft 22 in such a manner that it can pivot on the support shaft 22 in an up and down direction, a roller scriber 25 which is rotatably held to the other end of the scriber support member 23 by a rotary support shaft 24, and a pushing force urging means 26 for exerting pushing force to the scriber support member 23. The movable base 21 is disposed on a support base that is not shown in such a manner that it can move in a direction indicated by an arrow Y in FIG. 5 that is an indexing direction (direction perpendicular to the paper sheet in FIG. 8). The roller scriber 25 is formed from sintered diamond and rotatably held to the other end of the scriber support member 23 by the rotary support shaft 24 disposed in a direction perpendicular to the paper sheet in FIG. 8. The pushing force urging means 26 comprises an adjusting screw 261 screwed into a support portion 211 projecting from the upper end of the above movable base 21, a spring receiving plate 262 attached to the lower end of the control screw 261 and a coil spring 263 disposed between the spring receiving plate 262 and the top surface of the scriber support member 23. In the illustrated embodiment, the coil spring 263 and the control screw 261 are employed as the pushing force urging means, but an air piston may be also used as the pushing force urging means to control a pushing force by adjusting the pressure of air. The scribing machine in the illustrated embodiment is equipped with an alignment means 30 having a microscope or CCD camera. As shown in FIG. 9, a hairline (reference line) 301 formed on the microscope of the alignment means 30 and the peripheral contact portion of the roller scriber 25 of the above scribing unit 20 are adjusted to be aligned with each other. Although the scribing unit 20 comprises the roller scriber 25 in the illustrated embodiment, a point scriber may be used in place of the roller scriber 25.

A description will be subsequently given of the above scribing step in the present invention, which is carried out by the above scribing machine.

Figure 2:
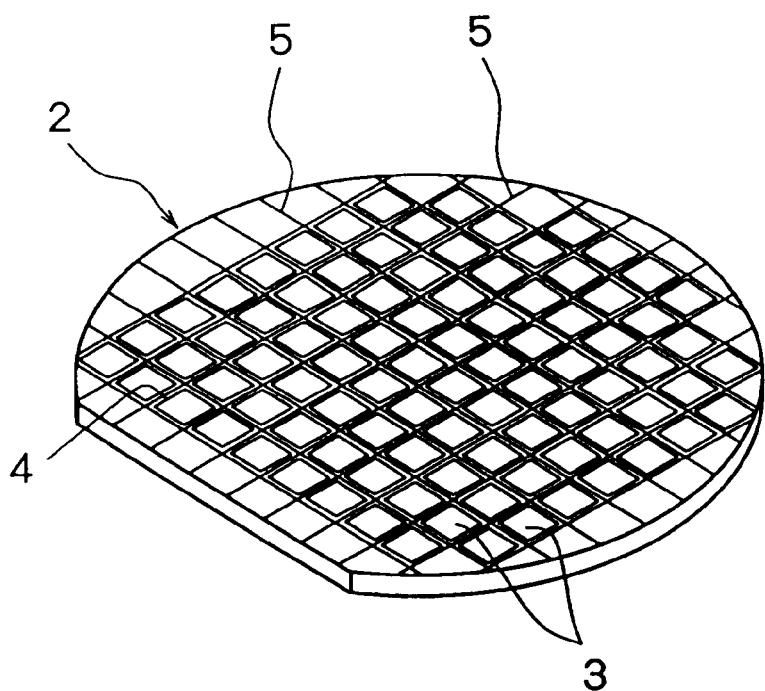
FIG. 2 is a perspective view of a semiconductor wafer having division guide lines formed by a scribing machine.

The semiconductor wafer 2 is first placed on the adsorption chuck 92 of the above chuck table 9 by an operator, for example. At this point, the semiconductor wafer 2 is so placed that its front side faces up. The back surface of the semiconductor wafer 2 placed on the adsorption chuck 92 is sucked by a suction means that is not shown and the semiconductor wafer 2 with its front side facing up is held on the adsorption chuck 92. The chuck table 9 which thus suction-holds the semiconductor wafer 2 is moved up to right below the alignment means 30. When the chuck table 9 is positioned right below the alignment means 30, the street 4 formed on the semiconductor wafer 2 is detected by the alignment means 30 and moved to be adjusted to a direction indicated by an arrow Y that is the indexing direction of the scribing unit 20, whereby the precision positioning is carried out. Thereafter, the chuck table 9 which suction-holds the semiconductor wafer 2 is moved in a direction indicated by the arrow X that is the feeding direction to allow the roller scriber 25 to scribe the street 4 of the semiconductor wafer 2 held on the chuck table 9. As a result, a scribed line is formed along the streets 4 to form a division guide line 5. The formation of the division guide line 5 by the roller scriber 25 is desirably carried out under a load of 50 to 150 g. This load can be adjusted by moving forward or backward the adjusting screw 261 of the pushing force urging means 26. Thus, movements in a direction indicated by the arrow Y that is the indexing direction of the scribing unit 20 and in a direction indicated by the arrow X that is the feeding direction of the chuck table 9 are carried out sequentially and repeatedly for all the streets 4 formed on the semiconductor wafer 2, thereby making it possible to form the division guide lines 5 along the streets 4 on the semiconductor wafer 2 as shown in FIG. 2.

After the scribing step for forming the division guide lines 5 along the streets 4 of the semiconductor wafer 2 is thus completed, the chuck table 9 holding the semiconductor wafer 2 is returned to the initial position where it suction-held the semiconductor wafer 2, and the suction-holding of the semiconductor wafer 2 is released at this position. Therefore, the semiconductor wafer 2 having the division guide lines 5 formed thereon in the scribing step can be taken out from the chuck table 9.

After the division guide lines 5 are thus formed along the streets 4 of the semiconductor wafer 2, the aforesaid tape sticking step is carried out. That is, as shown in FIG. 1(b), a tape 7 is stuck onto the surface of the semiconductor wafer 2 having the division guide lines 5 formed thereon. Therefore, the surfaces of each chips 3 formed on the surface of the semiconductor wafer 2 is stuck to the tape 7.

As described above, after the tape sticking step has been carried out, the aforesaid back surface cutting step is carried out. A dicing machine that is a cutting machine for carrying out this back surface cutting step will be described here with reference to FIGS. 11 and 12.

The dicing machine in the illustrated embodiment has a substantially rectangular parallelpiped housing 10. In this housing 10, a chuck table 11 for holding a workpiece is so disposed that it can move in a direction indicated by an arrow X that is a cutting direction. The chuck table 11 comprises an adsorption chuck support base 111 and an adsorption chuck 112 mounted on the adsorption chuck support base 111 so that the disk-like semiconductor wafer 2 which is a workpiece is held on the adsorption chuck 112 by a suction means that is not shown. The chuck table 11 is constituted to be allowed to turn by a rotation mechanism that is not shown.

The dicing machine in the illustrated embodiment comprises a spindle unit 40 as a cutting means. The spindle unit 40 comprises a spindle housing 41 that is mounted on a movable base (not shown) and moved to be adjusted to a direction indicated by an arrow Y that is an indexing direction and to a direction indicated by an arrow Z that is a cutting direction, a rotary spindle 42 that is rotatably held to the spindle housing 41 and rotatively driven by a rotary drive mechanism that is not shown, and a rotary blade 43 mounted to the rotary spindle 42. In the illustrated embodiment, a V-shaped blade is used as the rotary blade 43. The alignment means 30 in the illustrated dicing machine has an infrared CCD camera.

Figure 11:
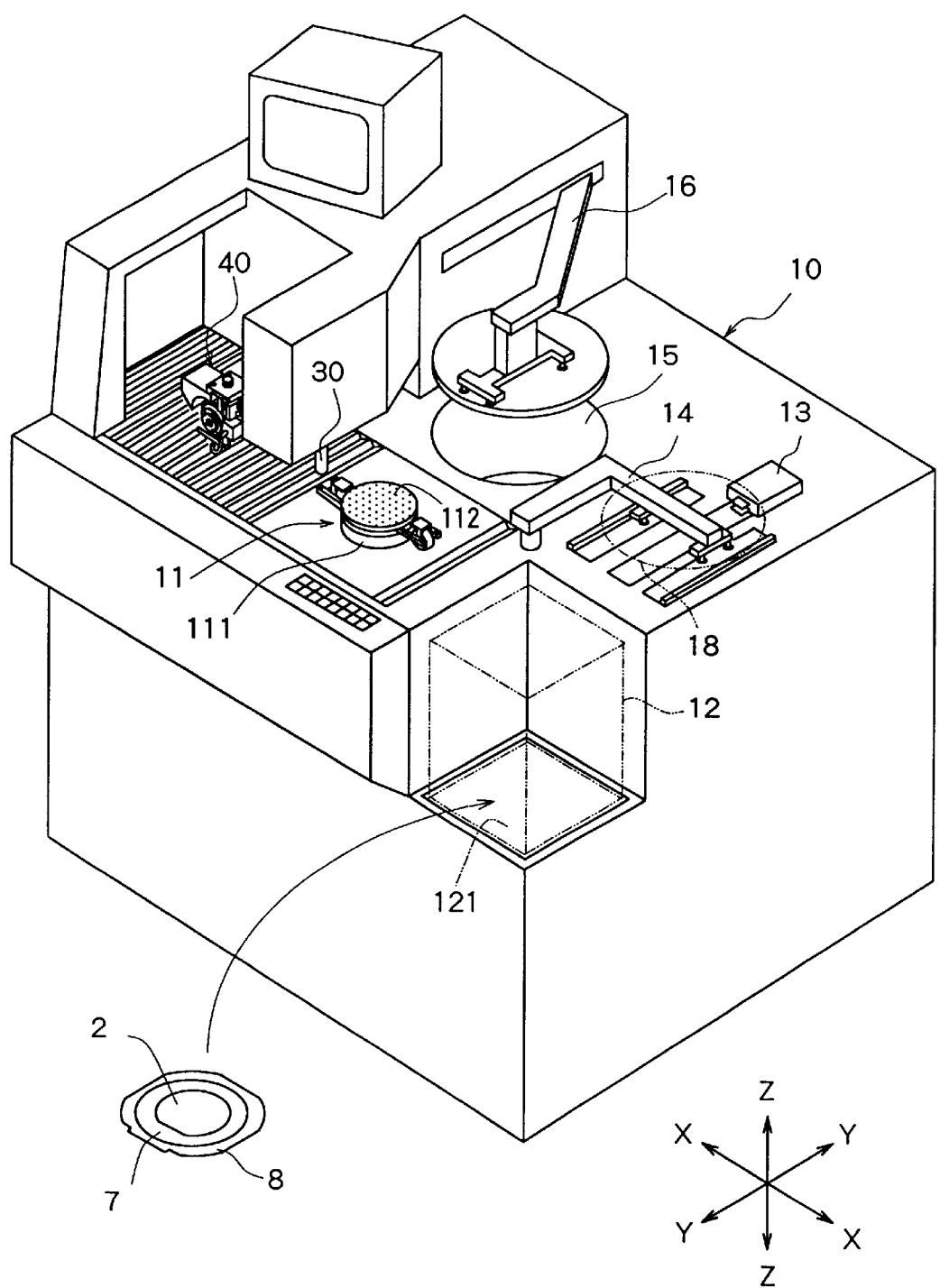
FIG. 11 is a perspective view of an embodiment of a dicing machine as a cutting machine for carrying out the back surface cutting step in the method of dividing a semiconductor wafer according to the present invention.
Figure 12:
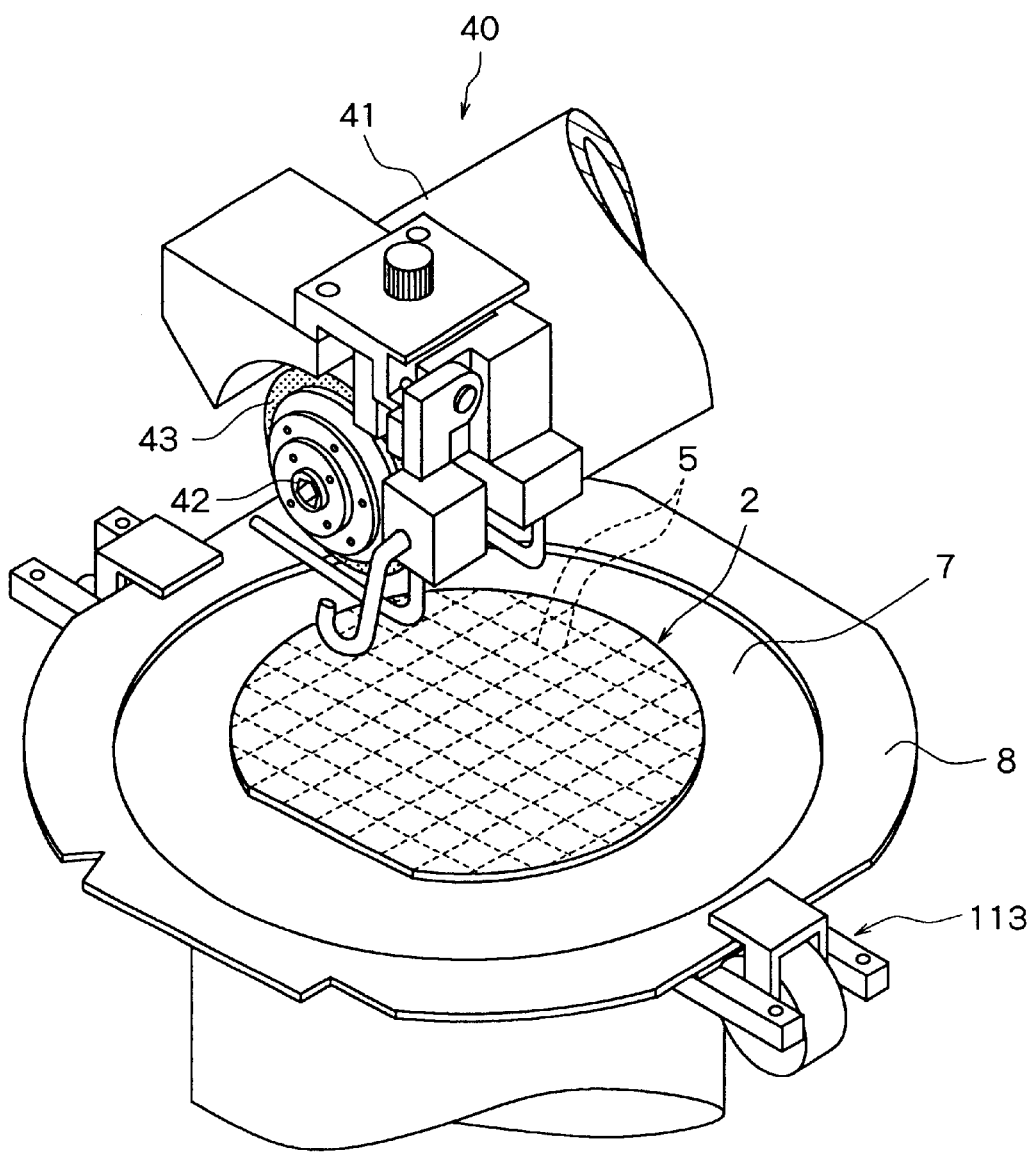
FIG. 12 is a perspective view of a main portion of the dicing machine shown in FIG. 11.

As shown in FIG. 11, the dicing machine in the illustrated embodiment comprises a cassette 12 for storing the semiconductor wafer 2 which is a workpiece, a workpiece carrying-out means 13, a workpiece carrying means 14, a cleaning means 15 and a cleaning and carrying means 16. The cassette 12 is placed on a cassette table 121 which is placed movably in an up and down direction by a lifting means that is not shown.

A description is subsequently given of the aforesaid back surface cutting step which is carried out by the above cutting machine.

The tape 7 stuck onto the surface of the semiconductor wafer 2 in the above tape sticking step is mounted on a frame 8, and the semiconductor wafer 2 is stored in the above cassette 12 in a state of being mounted on the frame 8 via the tape 7. Therefore, the semiconductor wafer 2 mounted on the frame 8 is stored in a state of its rear side facing up.

The semiconductor wafer 2 mounted on the frame 8 stored at a predetermined position of the cassette 12 (the semiconductor wafer 2 mounted on the frame 8 will be simply referred to as "semiconductor wafer 2" hereinafter) is brought to a carrying-out position by the up and down movement of the cassette table 121 by means of the lifting means that is not shown. The workpiece carrying-out means 13 moves back and forward to carry the semiconductor wafer 2 positioned at the carrying-out position to a workpiece placing area 18. The semiconductor wafer 2 brought to the workpiece placing area 18 is carried to the top of the adsorption chuck 112 of the above chuck table 11 by the turning movement of the workpiece carrying means 14, and its front side is suction-held to the adsorption chuck 112 in a state of its back side facing up. At this point, the frame 8 mounting the semiconductor wafer 2 via the tape 7 is secured by a clamp 113 provided on the chuck table 11. The chuck table 11 that has suction-held the semiconductor wafer 2 is then moved right below the alignment means 30. When the chuck table 11 is positioned right below the alignment means 30, the alignment means 30 detects the division guide lines 5 formed along the streets 4 of the semiconductor wafer 2 in the scribing step, and the semiconductor wafer 2 is moved to be adjusted to a direction indicated by an arrow Y that is the indexing direction of the spindle unit 40 to carry out precision positioning. Since the tape 7 is stuck onto the surface (surface on the side on which the division guide lines 5 are formed) of the semiconductor wafer 2 in the above tape sticking step, the rear side of the semiconductor wafer 2 faces up. However, as the alignment means 30 has an infrared CCD camera, it can detect the division guide lines 5 formed on the top surface side which faces down.

Figure 3:
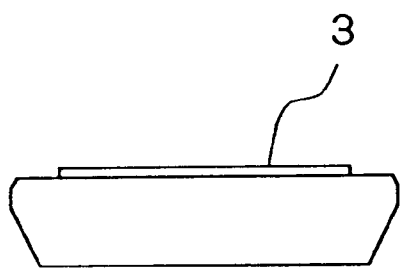
FIG. 3 is a front view of a chip divided by the method of dividing a semiconductor wafer according to the first embodiment of the present invention.

Thereafter, cutting groove 6 can be formed in the back surface of the semiconductor wafer 2 along the division guide line 5 by moving the chuck table 11 suction-holding the semiconductor wafer 2 in a direction indicated by an arrow X that is a cutting direction. At this point, the cutting by the rotary blade 43 is set to be made up to a position of 20 to 50 $\mu$m from the surface of the street 4 where the division guide line 5 is formed. That is, in the back surface cutting step, the cutting groove 6 is formed along division guide line 5 in the back surface of the semiconductor wafer 2 by the rotary blade 43 such that an uncut portion as high as 20 to 50 $\mu$m from the surface of the street 4 is left. The cutting groove 6 is thus formed along the division guide lines 5 in such a manner that the uncut portion as high as 20 to 50 $\mu$m from the surface of the street 4 is left, whereby the semiconductor wafer 2 is completely divided at the uncut portion with the aid of the division guide line 5. Then, the movements in a direction indicated by the arrow Y that is the indexing direction of the above spindle unit 40 and in a direction indicated by the arrow X that is the cutting direction of the chuck table 11 are carried out sequentially and repeatedly for all the division guide lines 5 formed on the semiconductor wafer 2, thereby making it possible to divide the semiconductor wafer 2 into individual chips 3 as exaggeratively shown in FIG. 3. The divided semiconductor chips are not separated from one another by the function of the tape 7, and the state of the semiconductor wafer 2 mounted on the frame 8 is maintained.

As described above, in the illustrated embodiment, by forming the cutting grooves 6 on the back surface side of the semiconductor wafer 2 along the division guide lines 5 formed by the scribed lines formed in the streets 4 of the semiconductor wafer 2 such that uncut portions are left, the uncut portions of is completely separated with the aid of the division guide lines 5 to divide the semiconductor wafer 2 into individual chips, thereby making it possible to extremely reduce the width of the streets 4 formed on the surface of the semiconductor wafer 2. Therefore, as the width of the streets 4 can be reduced to 10 μm or less, a large number of chips can be formed on the surface of the semiconductor wafer 2 and hence, productivity can be enhanced. In the illustrated embodiment, the individual chips are divided by forming the high reliable cutting grooves 6 along the division guide lines 5 on the back surface side where the division guide lines 5 have been formed in the streets 4 of the semiconductor wafer 2 in such a manner that uncut portions are left. Therefore, breakage or the like does not occur unlike cutting by a point scriber or laser beam, the product yield is high and hence, productivity can be improved. Although in the illustrated embodiment, a V-shaped blade is used as the rotary blade 43, a rounded blade as shown by a two-dot chain line in FIG. 1(c) may be used as the rotary blade 43.

When the semiconductor wafer 2 is thus divided into chips, the chuck table 11 holding the semiconductor wafer 2 is returned to the position where it suction-held the semiconductor wafer 2 at the start, the suction-holding of the semiconductor wafer 2 is released and the fixing of the frame 8 by the clamp 113 is also released at this position. Thereafter, the semiconductor wafer 2 is carried to the cleaning means 15 by the cleaning and carrying means 16 to be cleaned. The cleaned semiconductor wafer 2 is carried to the workpiece placing area 18 by the workpiece carrying means 14. The semiconductor wafer 2 is then stored at a predetermined position of the cassette 12 by the workpiece carrying-out means 13. Although the semiconductor wafer 2 which has been divided into chips retains the form of a semiconductor wafer by the tape 7, adjacent chips might be rubbed against each other and damaged during transportation as chips on the semiconductor wafer 2 has been individually divided. That is, when the semiconductor wafer 2 is divided into chips by cutting with a dicing machine which is generally carried out in the prior art, spaces equal to the thickness (about 20 μm) of the cutting blade are formed between chips. On the other hand, since chips obtained according to the dividing method of the present invention are divided by forming the cutting grooves 6 such that uncut portions are left by the cutting blade 43 as described above, the divided surfaces are substantially contacted to each other. Therefore, the tape 7 is bent downward due to self-weight of the separated chips, whereby the chips are rubbed against each other in a center direction.

It is desired to prevent adjacent chips from being rubbed against each other during transportation. To prevent this during transportation, the interval between adjacent chips is made large and the following measures are conceivable.

The first measure is to increase the interval between adjacent chips by holding both the frame and the tape stuck onto the chips with a frame such as an embroidery frame to stretch the whole tape. The second measure is to increase the interval between adjacent chips by turning upside down the frame mounting the divided chips via the tape to invert the surface having the chips so that the tape 7 is bent downward by the self weight of the divided chips.

As described above, according to the first embodiment of the present invention, after the division guide lines are formed by drawing the scribed lines along the streets on the surface of the semiconductor wafer and the tape is stuck onto the surface of the semiconductor wafer, the cutting grooves are formed in the back surface of the semiconductor wafer along the division guide lines such that uncut portions are left, whereby the semiconductor wafer is divided into chips by the uncut portions being completely separated with the aid of the division guide lines. This makes it possible to greatly reduce the width of the streets to be formed on the surface of the semiconductor wafer. Therefore, as the width of the streets can be reduced to 10 μm or less, a large number of chips can be formed on the surface of the semiconductor wafer and hence, productivity can be improved. Further, in the illustrated embodiment, the semiconductor wafer is divided into individual chips by forming the high reliable cutting grooves on the back surface side of the semiconductor wafer along the division guide lines formed in the streets of the semiconductor wafer such that uncut portions are left. Therefore, breakage or the like does not occur unlike cutting by a point scriber or laser beam, product yield is high and productivity can be improved.

A description is subsequently given of a method of dividing a semiconductor wafer according to the second embodiment of the present invention with reference to FIGS. 4 to 6.

Figure 4:
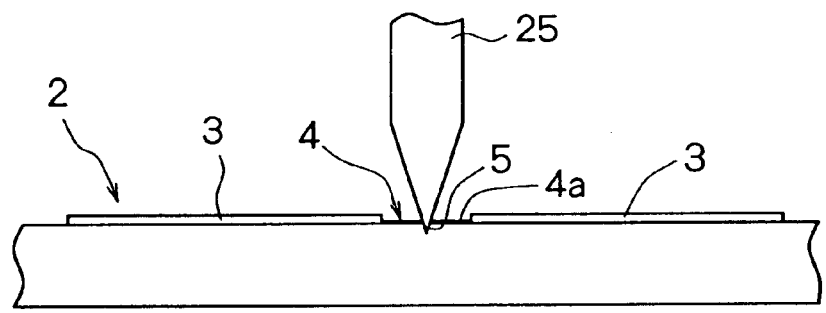
FIG. 4 are views for explaining each step of a method of dividing a semiconductor wafer according to a second embodiment of the present invention.
Figure 4:
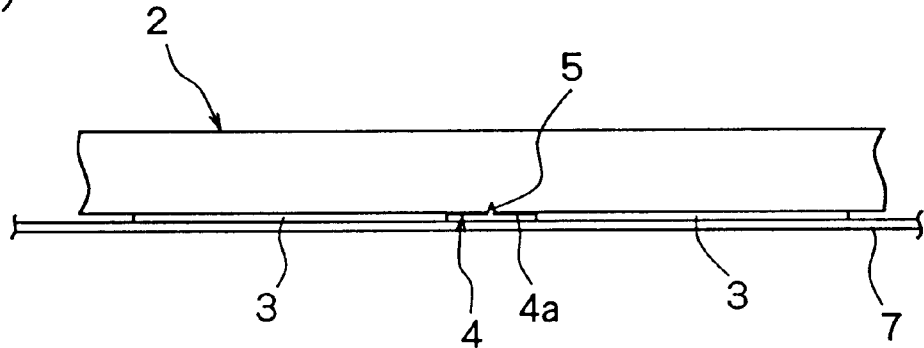
Figure 4:
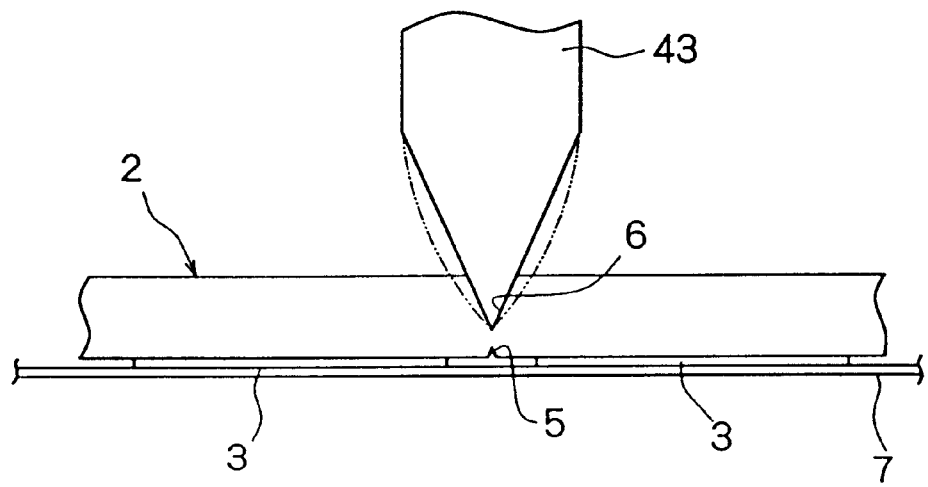
Figure 5:
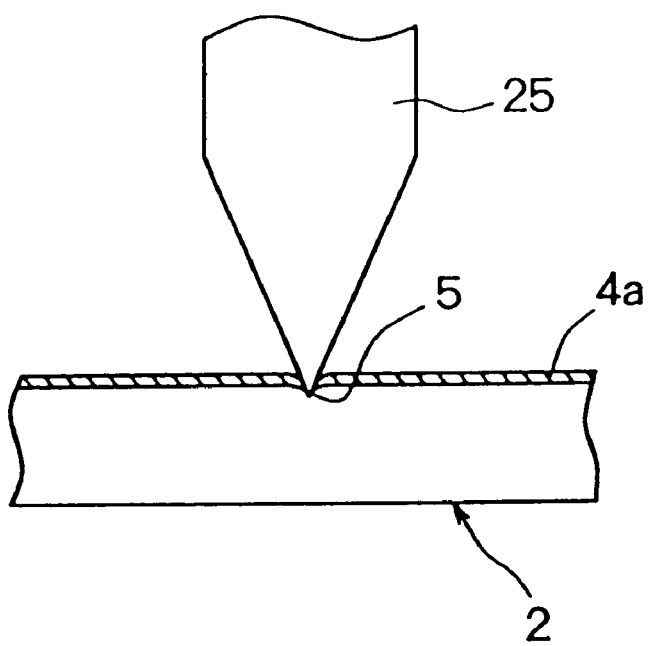
FIG. 5 is an enlarged view of a division guide line formed by a scribing machine.
Figure 6:
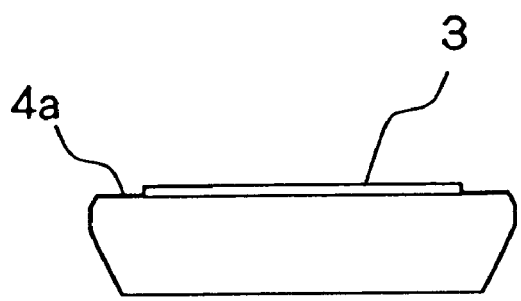
FIG. 6 is a front view of a chip obtained by the method of dividing a semiconductor wafer according to the second embodiment of the present invention.

The second embodiment shown in FIGS. 4 to 6 is the method of dividing a semiconductor wafer of which the surface has a plurality of chips sectioned by streets with a metal layer formed thereon.

The method of this embodiment shown in FIGS. 4 to 6 comprises a scribing step in which a division guide line 5 is formed by drawing a scribed line along street 4 which is formed between chips 3 formed on the surface of a semiconductor wafer 2 and of which the surface has a metal layer 4a formed thereon, as shown in FIG. 4(a), a tape sticking step in which a tape 7 is stuck onto the surface of the semiconductor wafer 2 having the division guide line 5 formed thereon as shown in FIG. 4(b), and a back surface cutting step in which cutting groove 6 is formed in the back surface of the semiconductor wafer 2 along the division guide line 5 as shown in FIG. 4(c), like the above-described method of dividing a semiconductor wafer shown in FIG. 1.

The scribing step shown in FIG. 3(a) is carried out by the above-described scribing machine shown in FIGS. 7 to 10 in the same manner as the above-described scribing step shown in FIG. 1(a). At this point, as shown in FIG. 5, the metal layer 4a formed on the surface of the streets 4 between the chips formed on the surface of the semiconductor wafer 2 is broken by the pressure contact of the roller scriber 25.

After the division guide lines 5 have been formed along the streets 4 of the semiconductor wafer 2 by carrying out the scribing step, the tape sticking step shown in FIG. 4(b) is carried out. This tape sticking step is identical to the above-described tape sticking step shown in FIG. 1(b).

After the tape sticking step has been carried out as described above, the back surface cutting step shown in FIG. 4(c) is carried out. This back surface cutting step is carried out by the above-described dicing machine shown in FIGS. 11 and 12 in the same manner as the above-described back surface cutting step shown in FIG. 1(c). By carrying out the back surface cutting step, the semiconductor wafer 2 can be divided into chips as exaggeratively shown in FIG. 6.

As described above, in the second embodiment shown in FIGS. 4 to 6, the division guide lines 5 are formed along the streets 4 formed on the semiconductor wafer 2 in such a way that the metal layer is broken by the roller scriber 25, and the cutting grooves 6 are formed in the back surface of the semiconductor wafer 2 along the division guide lines 5 such that uncut portions are left, whereby the uncut portions are completely separated with the aid of the division guide lines 5 to divide the semiconductor wafer 2 into individual chips. Therefore, the rotary blade 43 does not contact the metal layer formed on the streets 4. Accordingly, the formation of a burr caused by the breakage of the metal layer by the rotary blade 43 can be prevented.

As described above, in the method of dividing a semiconductor wafer according to the second embodiment of the present invention, after the division guide lines are formed by drawing scribed lines along the streets with the metal layer formed thereon, of the semiconductor wafer and the tape is stuck onto the surface of the semiconductor wafer, the cutting grooves are formed in the back surface of the semiconductor wafer along the division guide lines such that uncut portions are left, whereby the uncut portions are completely separated with the aid of the division guide lines thereby to divide the semiconductor wafer into individual chips. Therefore, the cutting tool for forming the cutting grooves does not contact the metal layer formed on the streets. Accordingly, the formation of a burr caused by the breakage of the metal layer by the cutting tool can be prevented.

What is claimed is:

1. A method of dividing a semiconductor wafer, of which the surface has a plurality of chips sectioned by streets, into individual chips, characterized in that said method comprises:

a scribing step in which division guide lines are formed by drawing scribed lines along the streets on the surface of said semiconductor wafer;

a tape sticking step in which a tape is stuck onto the surface having said division guide lines formed thereon, of said semiconductor wafer; and a back surface cutting step in which cutting grooves are formed in the back surface, to which said tape has been stuck, of said semiconductor wafer such that a bit of uncut portions are left along said division guide lines, and:
by the formation of said cutting grooves, said uncut portions are completely separated with the aid of said division guide lines to divide said semiconductor wafer into individual chips.

2. The method of dividing a semiconductor wafer according to claim 1, wherein said division guide lines formed in said scribing step are formed by a scriber and said cutting grooves formed in said back surface cutting step are formed by a rotary blade.

3. A method of dividing a semiconductor wafer, of which the surface has a plurality of chips sectioned by streets with a metal layer formed thereon, into individual chips, characterized in that the method comprises:

a scribing step in which division guide lines are formed by drawing scribed lines along streets on the surface of said semiconductor wafer;

a tape sticking step in which a tape is stuck onto the surface having said division guide lines formed thereon, of said semiconductor wafer; and a back surface cutting step in which cutting grooves are formed in the back surface, to which said tape has been stuck, of said semiconductor wafer such that a bit of uncut portions are left along said division guide lines, and:
by the formation of said cutting grooves, said uncut portions are completely separated with the aid of said division guide lines to divide said semiconductor wafer into individual chips.

4. The method of dividing a semiconductor wafer according to claim 3, wherein said division guide lines formed in said scribing step are formed by breaking said metal layer formed on the streets by a roller scriber and said cutting grooves formed in said back surface cutting step are formed by a rotary blade.

* * * * *